United States Patent
Niu et al.

(10) Patent No.: US 11,983,042 B2
(45) Date of Patent: May 14, 2024

(54) DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wenxiao Niu, Beijing (CN); Lianbin Liu, Beijing (CN); Hengzhen Liang, Beijing (CN); Shiheng Mu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 247 days.

(21) Appl. No.: 17/770,668

(22) PCT Filed: Jun. 9, 2021

(86) PCT No.: PCT/CN2021/099098
§ 371 (c)(1),
(2) Date: Apr. 21, 2022

(87) PCT Pub. No.: WO2022/017036
PCT Pub. Date: Jan. 27, 2022

(65) Prior Publication Data
US 2022/0374048 A1    Nov. 24, 2022

(30) Foreign Application Priority Data
Jul. 22, 2020   (CN) .......................... 202010711095.3

(51) Int. Cl.
*G06F 1/16* (2006.01)
*G06F 3/044* (2006.01)
(Continued)

(52) U.S. Cl.
CPC .......... *G06F 1/1652* (2013.01); *G06F 1/1643* (2013.01); *G06F 3/0446* (2019.05);
(Continued)

(58) Field of Classification Search
CPC .... G06F 1/1652; G06F 1/1643; G06F 3/0446; H05K 1/189; H01Q 1/243
See application file for complete search history.

(56) References Cited

U.S. PATENT DOCUMENTS 9,804,639 B2 * 10/2017 Posner ................ G02F 1/13306
2019/0058264 A1    2/2019 Jung et al.
2021/0407389 A1 * 12/2021 Luo ........................ H01L 27/12

FOREIGN PATENT DOCUMENTS

CN         106547382 A     3/2017
CN         206879291 U     1/2018
(Continued)

*Primary Examiner* — Mukundbhai G Patel
(74) *Attorney, Agent, or Firm* — IP & T GROUP LLP

(57) ABSTRACT

A display apparatus includes an antenna and a first bending portion. The antenna includes an antenna feed point. An end of the first bending portion is connected to a side edge of a touch film proximate to the antenna feed point, and another end of the first bending portion is provided with a first bonding pin group and a first redundant pin group. The first redundant pin group is located on a side of the first bonding pin group proximate to a first plane, such that a wiring blank area of the first bending portion is formed on a side of a connection lead group proximate to the first plane.

15 Claims, 15 Drawing Sheets

(51) Int. Cl.
*H01Q 1/24* (2006.01)
*H05K 1/18* (2006.01)

(52) U.S. Cl.
CPC ............. *H01Q 1/243* (2013.01); *H05K 1/189* (2013.01); *H05K 2201/10128* (2013.01)

(56) References Cited

FOREIGN PATENT DOCUMENTS

| CN | 109375822 A | 2/2019 |
|----|-------------|--------|
| CN | 110392134 A | 10/2019 |
| CN | 111371926 A | 7/2020 |
| CN | 111651096 A | 9/2020 |

\* cited by examiner

A-A

DISPLAY APPARATUS

CROSS-REFERENCE TO RELATED APPLICATIONS

This application is a national phase entry under 35 USC 371 of International Patent Application No. PCT/CN 2021/099098 filed on Jun. 9, 2021, which claims priority to Chinese Patent Application No. 202010711095.3, filed on Jul. 22, 2020, which are incorporated herein by reference in their entirety.

TECHNICAL FIELD

The present disclosure relates to the field of display technologies, and in particular, to a display apparatus.

BACKGROUND

In a display apparatus such as a mobile phone, an antenna is usually provided for transmitting and receiving signals. However, many electronic components and signal lines are provided in the display apparatus. How to reduce the signal interference of the components and the signal lines inside the display apparatus to the antenna becomes a research hotspot for those skilled in the art.

SUMMARY

Some embodiments of the present disclosure provide a display apparatus. The display apparatus includes a display panel, a touch film, a circuit board, an antenna and a first bending portion. The touch film is stacked on a display side of the display panel, and includes a touch electrode. The circuit board is disposed on a side of the display panel away from the touch film. The antenna is located on a side of the display panel, and includes an antenna feed point. In a first direction, an end of the first bending portion is connected to a side edge of the touch film proximate to the antenna feed point, and another end of the first bending portion is provided with a first bonding pin group and a first redundant pin group that are arranged in a second direction and bonded to the circuit board. The first direction is an extending direction of the first bending portion, and the second direction is perpendicular to the first direction and a thickness direction of the touch film. The first bending portion is further provided with a connection lead group, and the first bonding pin group is electrically connected to the touch electrode through the connection lead group. The first redundant pin group is located on a side of the first bonding pin group proximate to a first plane, so that a wiring blank area of the first bending portion is formed on a side of the connection lead group proximate to the first plane. The first plane passes through the antenna feed point, and is perpendicular to the second direction.

In some embodiments, the first bonding pin group includes a first sub-pin group and a second sub-pin group. The first sub-pin group and the second sub-pin group are arranged at an interval in the second direction, and are located on two sides of the first plane, respectively. A distance between a side of the first sub-pin group proximate to the first plane and the first plane is greater than a distance between a side of the first redundant pin group proximate to the first plane and the first plane. The touch electrode includes a first electrode array and a second electrode array. The connection lead group includes a first sub-lead group and a second sub-lead group. The first sub-pin group is electrically connected to the first electrode array through the first sub-lead group, and the second sub-pin group is electrically connected to the second electrode array through the second sub-lead group. The first redundant pin group and the second sub-pin group are located on a same side of the first plane. The first redundant pin group is located between the second sub-pin group and the first plane. The wiring blank area is located between the second sub-lead group and the first plane.

In some embodiments, the touch film and the display panel are arranged separately. The display apparatus further comprises a second bending portion and a drive chip. A first end of the second bending portion is connected to a first side edge of the display panel, and a second end of the second bending portion is connected to the circuit board. The first side edge is a side edge of the display panel proximate to the first bending portion. The drive chip is disposed on an outer side surface of the second bending portion. The first bending portion is a touch circuit board including a first sub-circuit board and a second sub-circuit board that extend in the first direction. The first sub-circuit board and the second sub-circuit board are arranged at an interval in the second direction, and are located on two sides of the drive chip, respectively. In the first direction, a first end of the first sub-circuit board is connected to the touch film, and a second end of the first sub-circuit board is provided with the first sub-pin group. The first sub-lead group is located on the first sub-circuit board. In the first direction, a first end of the second sub-circuit board is connected to the touch film, and a second end of the second sub-circuit board is provided with the second sub-pin group and the first redundant pin group. The second sub-lead group and the wiring blank area are located on the second sub-circuit board.

In some embodiments, the first bonding pin group further includes a third sub-pin group disposed on the second end of the first sub-circuit board and a fourth sub-pin group disposed on the second end of the second sub-circuit board. The third sub-pin group and the first sub-pin group are arranged in the second direction. The fourth sub-pin group and the second sub-pin group are arranged in the second direction, and the fourth sub-pin group is located on a side of the second sub-pin group away from the first redundant pin group. The connection lead group further includes a third sub-lead group and a fourth sub-lead group. The third sub-pin group is electrically connected to the second electrode array through the third sub-lead group, and the fourth sub-pin group is electrically connected to the first electrode array through the fourth sub-lead group.

In some embodiments, a second bonding pin group that is bonded to the touch film is further provided on an end of the first bending portion proximate to the touch film. The second bonding pin group includes a fifth sub-pin group and a sixth sub-pin group that are disposed on the first end of the first sub-circuit board and arranged in the second direction. The fifth sub-pin group is electrically connected to the first electrode array, and the first sub-lead group is connected between the first sub-pin group and the fifth sub-pin group. The sixth sub-pin group is electrically connected to the second electrode array, and the third sub-lead group is connected between the third sub-pin group and the sixth sub-pin group. The second bonding pin group further includes a seventh sub-pin group, an eighth sub-pin group, and a second redundant pin group that are disposed on the first end of the second sub-circuit board and arranged in the second direction. The second redundant pin group is located on a side of the seventh sub-pin group and the eighth sub-pin group proximate to the first plane. The seventh sub-pin group is electrically connected to the second electrode array, and the second sub-lead group is connected between the second sub-pin group and the seventh sub-pin group. The eighth sub-pin group is electrically connected to the first electrode array, and the fourth sub-lead group is connected between the fourth sub-pin group and the eighth sub-pin group.

In some embodiments, in the second direction, a dimension of a bonding area formed by the fifth sub-pin group and the sixth sub-pin group is $d_1$, and a dimension of a bonding area formed by the second redundant pin group, the seventh sub-pin group and the eighth sub-pin group is $d_2$. Here, $d_1$ and $d_2$ satisfy that $d_1$ is equal to $d_2$.

In some embodiments, in the second direction, a dimension of a bonding area formed by the first sub-pin group and the third sub-pin group is $D_1$, and a dimension of a bonding area formed by the first redundant pin group, the second sub-pin group and the fourth sub-pin group is $D_2$. Here, $D_1$ and $d_1$ satisfy that $D_1$ is equal to $d_1$, and $D_2$ and $d_2$ satisfy that $D_2$ is equal to $d_2$.

In some embodiments, the first sub-circuit board and the second sub-circuit board are located on the two sides of the first plane, respectively, and a distance between the first sub-circuit board and the first plane is greater than a distance between the second sub-circuit board and the first plane.

In some embodiments, in the second direction, a width of a gap between the first plane and the first sub-circuit board is in a range of 2.2 mm to 7 mm. In the second direction, a width of a gap between the first plane and the second sub-circuit board is in a range of 0.2 mm to 5 mm. In the second direction, a dimension of the wiring blank area is greater than or equal to 3 mm.

In some embodiments, the display panel is a flexible display panel, and the second bending portion and the display panel are of an integrative structure.

In some embodiments, the touch film is integrated with the display panel. The display panel is a flexible display panel, and the first bending portion and the display panel are of an integrative structure.

In some embodiments, the touch film further includes touch lead groups, and the touch lead groups include a first touch lead group electrically connected to the first electrode array and a second touch lead group electrically connected to the second electrode array. The first sub-pin group is electrically connected to the first electrode array through the first sub-lead group and the first touch lead group, and the second sub-pin group is electrically connected to the second electrode array through the second sub-lead group and the second touch lead group.

In some embodiments, the first bonding pin group includes a first sub-pin group and a second sub-pin group. The second sub-pin group, the first sub-pin group and the first redundant pin group are sequentially arranged in the second direction, and are located on a same side of the first plane. The touch electrode includes a first electrode array and a second electrode array. The connection lead group includes a first sub-lead group and a second sub-lead group. The first sub-pin group is electrically connected to the first electrode array through the first sub-lead group, and the second sub-pin group is electrically connected to the second electrode array through the second sub-lead group. The first redundant pin group is located between the first sub-pin group and the first plane. The wiring blank area is located between the first sub-lead group and the first plane.

In some embodiments, the touch film and the display panel are arranged separately. The first bending portion is a touch circuit board including a first sub-circuit board and a second sub-circuit board that extend in the first direction. The first sub-circuit board and the second sub-circuit board are arranged at an interval in the second direction, and are located on the same side of the first plane. The first sub-circuit board is located on a side of the second sub-circuit board proximate to the first plane. In the first direction, a first end of the first sub-circuit board is connected to the touch film, and a second end of the first sub-circuit board is provided with the first sub-pin group and the first redundant pin group. The first sub-lead group and the wiring blank area are located on the first sub-circuit board. In the first direction, a first end of the second sub-circuit board is connected to the touch film, and a second end of the second sub-circuit board is provided with the second sub-pin group. The second sub-lead group is located on the second sub-circuit board.

In some embodiments, the display apparatus further includes a housing including a front housing and a rear housing. The front housing includes a front-housing bottom wall and a front-housing side wall located on a periphery of the front-housing bottom wall. The front-housing side wall is provided with a flange extending to an outer side of the front housing. The rear housing includes a rear-housing bottom wall and a rear-housing side wall located on a periphery of the rear-housing bottom wall. The rear-housing side wall is clamped on an outer side of the front-housing side wall, and abuts against the flange, so that the front housing and the rear housing are fastened together, and an installation space is formed between the front-housing bottom wall and the rear-housing bottom wall. The display panel, the touch film, the antenna, and the first bending portion are disposed in the front housing. The circuit board includes a main board and a connection circuit board, and the main board is located in the installation space. An end of the connection circuit board is located in the front housing, and another end of the connection circuit board extends into the installation space, and is electrically connected to the main board.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
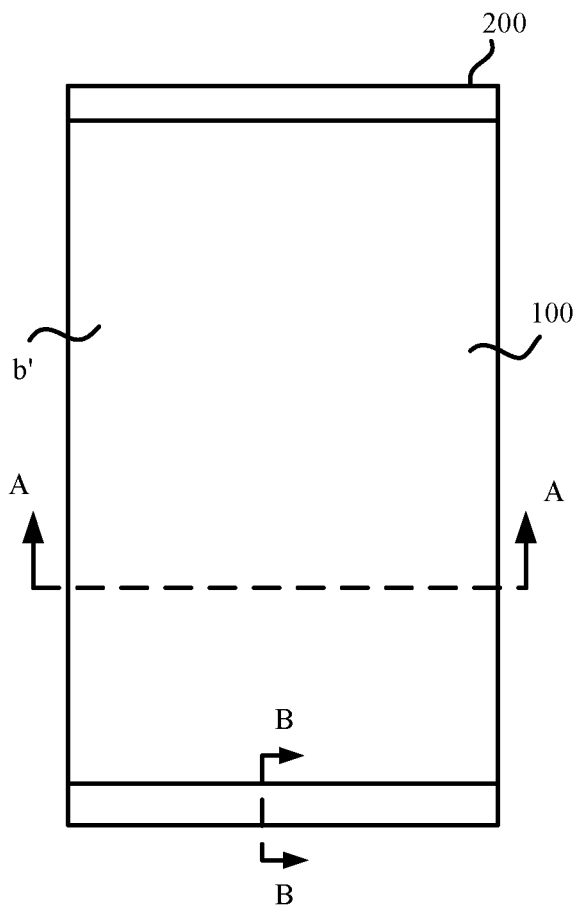
FIG. 1 is a schematic structural diagram of a display apparatus, in accordance with some embodiments of the present disclosure.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other.

The phrase "at least one of A, B and C" has a same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of "applicable to" or "configured to" herein means an open and inclusive expression, which does not exclude devices that are applicable to or configured to perform additional tasks or steps.

Additionally, the use of the phase "based on" is meant to be open and inclusive, since a process, step, calculation or other action that is "based on" one or more of the stated conditions or values may be, in practice, based on additional conditions or values beyond those stated.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. Therefore, the regions shown in the accompanying drawings are schematic in nature, and their shapes are not intended to show actual shapes of the regions in a device, and are not intended to limit the scope of the exemplary embodiments.

A display apparatus in the embodiments of the present disclosure may be a display apparatus with an antenna therein, such as a mobile phone, a tablet computer, a wireless advertisement screen, which is not limited herein.

A structure of the display apparatus will be described below considering a mobile phone as an example, and other types of display apparatuses may be set with reference to the structure of the mobile phone in the embodiments.

As shown in FIG. 1, a front view of the display apparatus (i.e., the mobile phone) in some embodiments of the present disclosure is shown in this figure. The display apparatus includes a housing 200 and a display module 100 disposed in the housing 200. An area shown by the reference b' is a display area of the display apparatus.

Figure 2:
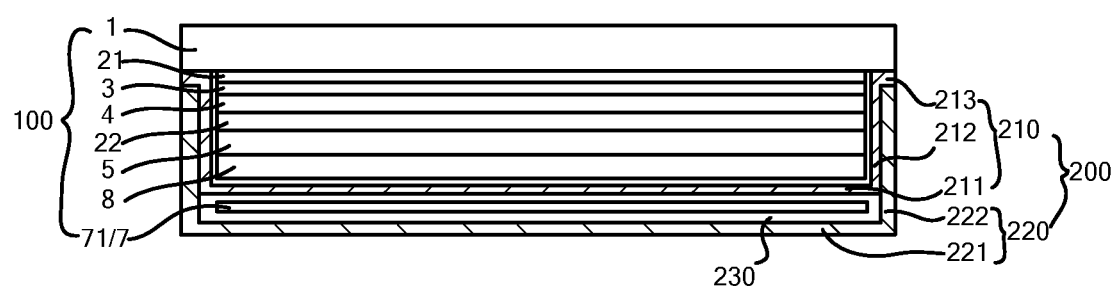
FIG. 2 is a sectional view taken along the A-A direction in FIG. 1.
Figure 3:
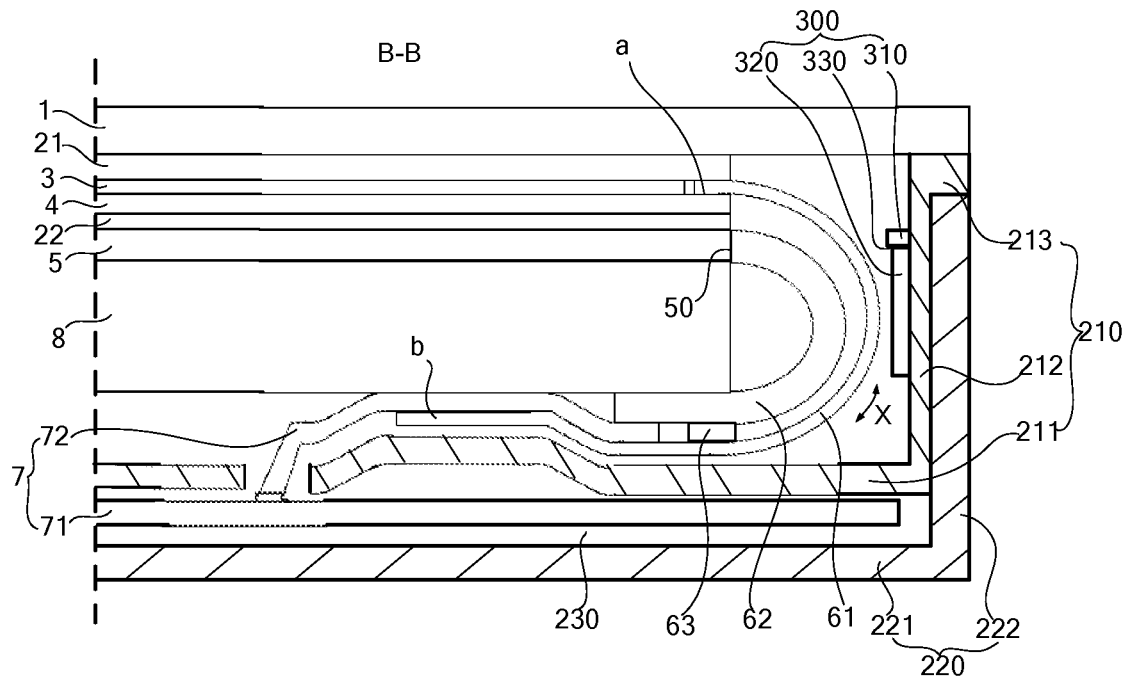
FIG. 3 is a sectional view taken along the B-B direction in FIG. 1.

In some embodiments, as shown in FIGS. 2 and 3 (FIG. 2 is a sectional view taken along the A-A direction in FIG. 1, and FIG. 3 is a sectional view taken along the B-B direction in FIG. 1), the housing 200 includes a front housing 210 and a rear housing 220. The front housing 210 includes a front-housing bottom wall 211 and a front-housing side wall 212 located on a periphery of the front-housing bottom wall 211, and the front-housing side wall 212 is provided with a flange 213 extending to an outer side of the front housing 210. The rear housing 220 includes a rear-housing bottom wall 221 and a rear-housing side wall 222 located on a periphery of the rear-housing bottom wall 221. The rear-housing side wall 222 is clamped on an outer side of the front-housing side wall 212, and abuts against the flange 213, so that the front housing 210 and the rear housing 220 are fastened together. An installation space 230 is formed between the front-housing bottom wall 211 and the rear-housing bottom wall 221. By providing the housing 200 as the front housing 210 and the rear housing 220 that are fastened together, it is convenient to disassemble and replace component(s) in the installation space 230.

As shown in FIG. 3, the display apparatus further includes an antenna 300. The antenna 300 is provided on the front-housing side wall 212 located on a side of a display panel 5. The antenna 300 includes a radiator 310 and a feed 320, and an antenna feed point 330 is formed at a junction of the feed 320 and the radiator 310.

As shown in FIG. 3, the display module 100 includes a cover plate 1, a first adhesive layer 21, a polarizer 3, a touch film 4, a second adhesive layer 22, the display panel 5, and a heat dissipation film (also called shield cushion film) 8 that are stacked in sequence. As shown in FIG. 3, the display module 100 further includes a first bending portion 61, a second bending portion 62, a drive chip 63 and a circuit board 7.

The cover plate 1 is provided at an opening of the front housing 210. The first adhesive layer 21 is used for adhering the cover plate 1 to the polarizer 3, and the second adhesive layer 22 is used for adhering the touch film 4 to the display panel 5. The first adhesive layer 21 and the second adhesive layer 22 may be transparent adhesive (also called optically clear adhesive, OCA) layers, but are not limited thereto, and may also be other adhesive layers capable of realizing adhesion. In addition to the separated arrangement shown in FIG. 3, the polarizer 3 and the touch film 4 may be integrated together, which may be determined according to actual situations.

As shown in FIG. 3, the display panel 5 is a flexible display panel, such as an organic light-emitting diode (OLED) display panel. A first end of the second bending portion 62 is connected to a first side edge 50 of the display panel 5, and a second end of the second bending portion 62 is connected to an end of a connection circuit board 72 located in the front housing 210. The first side edge 50 is a side edge of the display panel 5 proximate to the first bending portion 61. The drive chip (also called drive IC) 63 is provided on an outer side surface of the second bending portion 62 (i.e., a side surface of the second bending portion 62 proximate to the front housing 210).

As shown in FIG. 3, the second bending portion 62 and the display panel 5 may be of an integrative structure, so that a bonding area for bonding the second bending portion 62 is omitted from the display panel 5, thereby reducing a bezel size of the display apparatus.

As shown in FIG. 3, the circuit board 7 is located on a side of the heat dissipation film 8 away from the display panel 5, and includes a main board 71 and the connection circuit board 72. The main board 71 is located in the installation space 230 between the front-housing bottom wall 211 and the rear-housing bottom wall 221. The end of the connection circuit board 72 is located in the front housing 210, and another end of the connection circuit board 72 extends into the installation space 230, and is electrically connected to the main board 71. The connection circuit board 72 is provided to connect the first bending portion 61 to the main board 71 and connect the second bending portion 62 to the main board 71, so that the main board 71 is not required to be attached to a backside surface of the heat dissipation film 8, thereby increasing a position arrangement flexibility of the main board 71. For example, as shown in FIG. 3, the main board 71 is provided in the installation space 230, and the main board 71 may be disassembled and assembled separately after the rear housing 220 is removed.

As shown in FIG. 3, the first bending portion 61 is a touch circuit board. In a first direction X (i.e., an extending direction of the first bending portion 61), an end (i.e., the a end shown in the figure) of the first bending portion 61 is bonded to a side edge of the touch film 4 proximate to the antenna feed point 330, and another end (i.e., the b end shown in the figure) of the first bending portion 61 is bonded to the connection circuit board 72.

Figure 4:
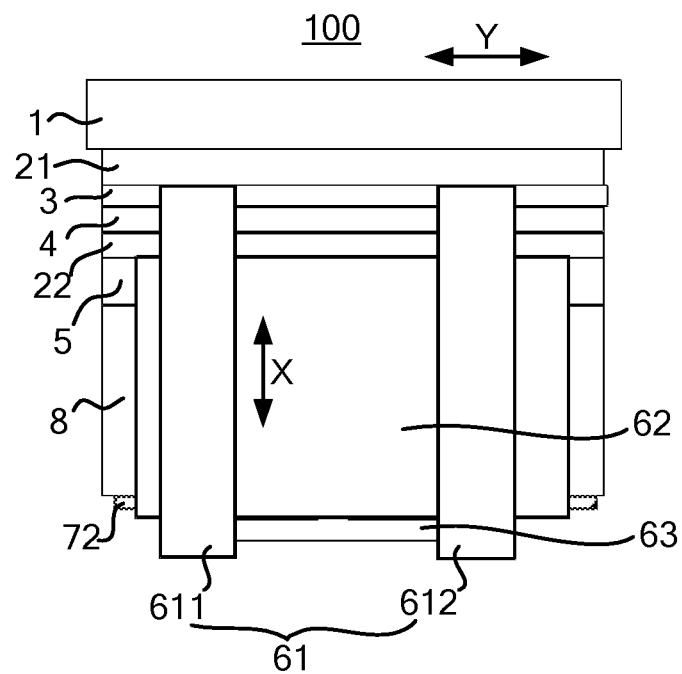
FIG. 4 is a right view of a display module in FIG. 3 with a circuit board removed.

As shown in FIG. 4 (FIG. 4 is a right view of the display module in FIG. 3), the first bending portion 61 includes a first sub-circuit board 611 and a second sub-circuit board 612. The first sub-circuit board 611 and the second sub-circuit board 612 are arranged at an interval in a second direction Y, and are located on two sides of the drive chip 63, respectively. The second direction Y is perpendicular to the first direction X and a thickness direction of the touch film 4. In these embodiments, as shown in FIGS. 3 and 4, the first bending portion 61 is made into two sub-circuit boards respectively located on the two sides of the drive chip 63, so that not only a position interference between the first bending portion 61 and the drive chip 63 is avoided, but also an arrangement between the first bending portion 61 and the second bending portion 62 is more compact. Thus, a space (i.e., a space of a lower bezel) between the display module 100 and the front-housing side wall 212 is fully utilized, thereby reducing a size of the lower bezel of the display apparatus.

Figure 5:
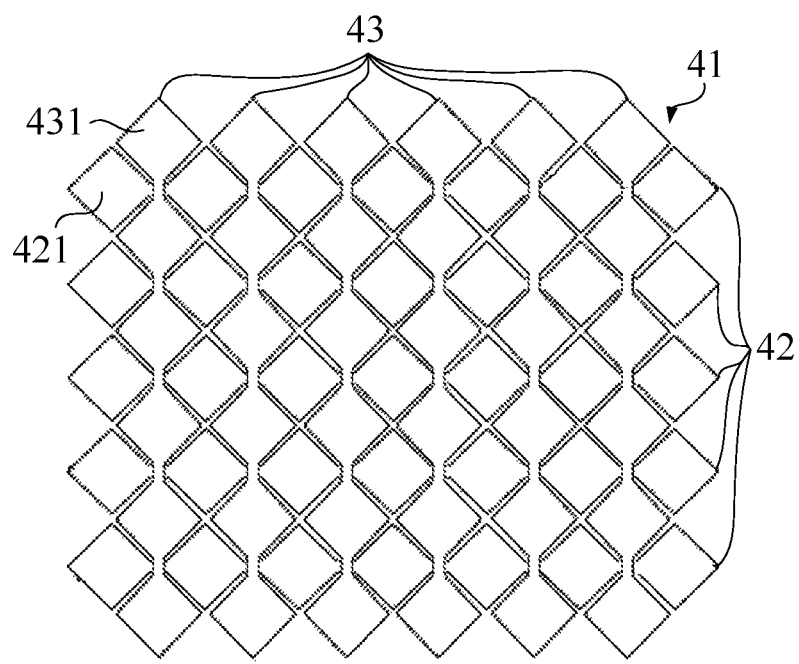
FIG. 5 is a schematic diagram of an arrangement of a touch electrode on a touch film, in accordance with some embodiments of the present disclosure.

As shown in FIG. 5 (FIG. 5 is a schematic diagram of an arrangement of a touch electrode 41 on the touch film 4), the touch electrode 41 includes a first electrode array 42 and a second electrode array 43. The first electrode array 42 is a sensing (RX) electrode array, and includes a plurality of rows of sensing electrodes 421. The second electrode array 43 is a driving (TX) electrode array, and includes a plurality of columns of driving electrodes 431.

Figure 6:
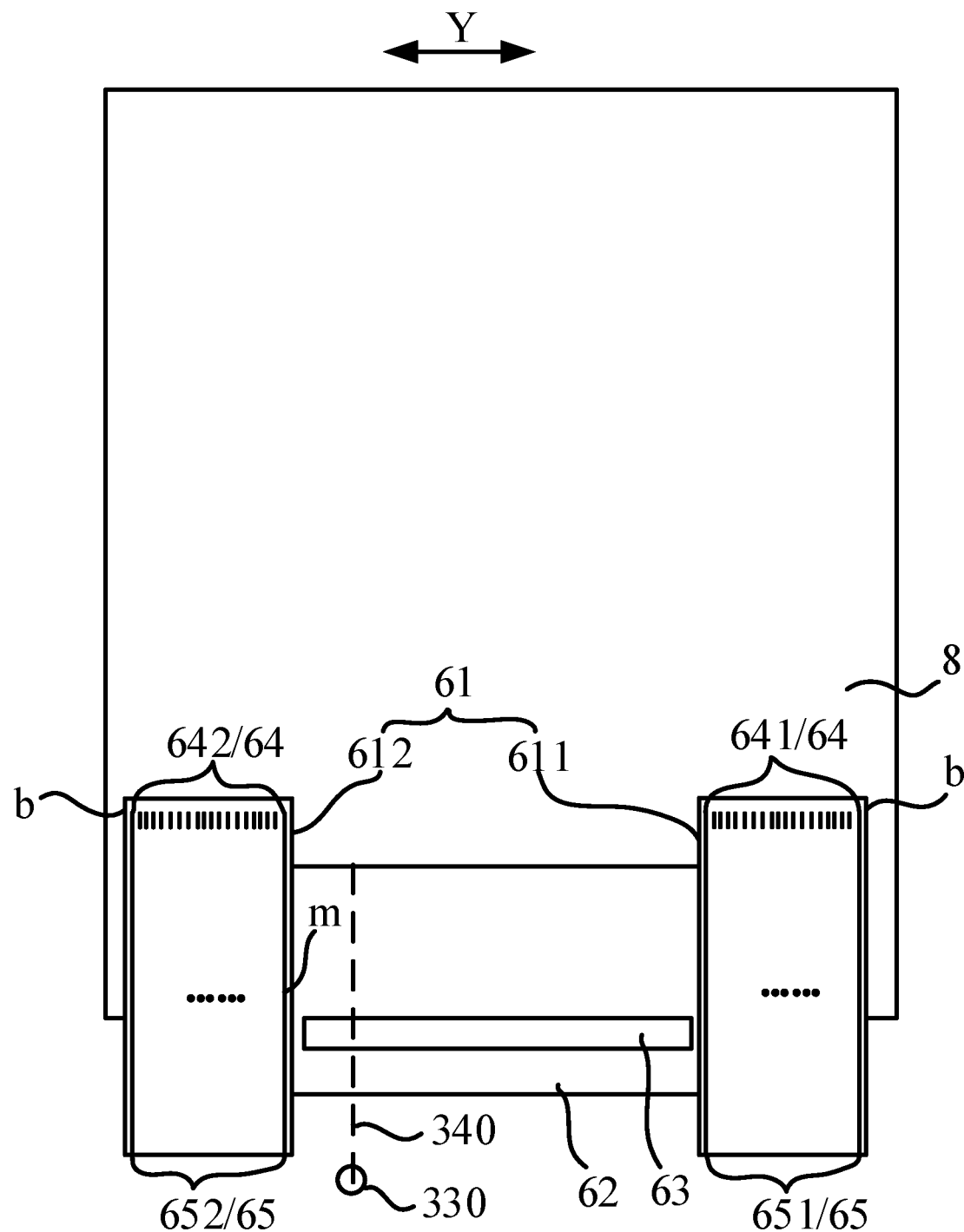
FIG. 6 is a bottom view of a display module, in accordance with some embodiments of the present disclosure.
Figure 7:
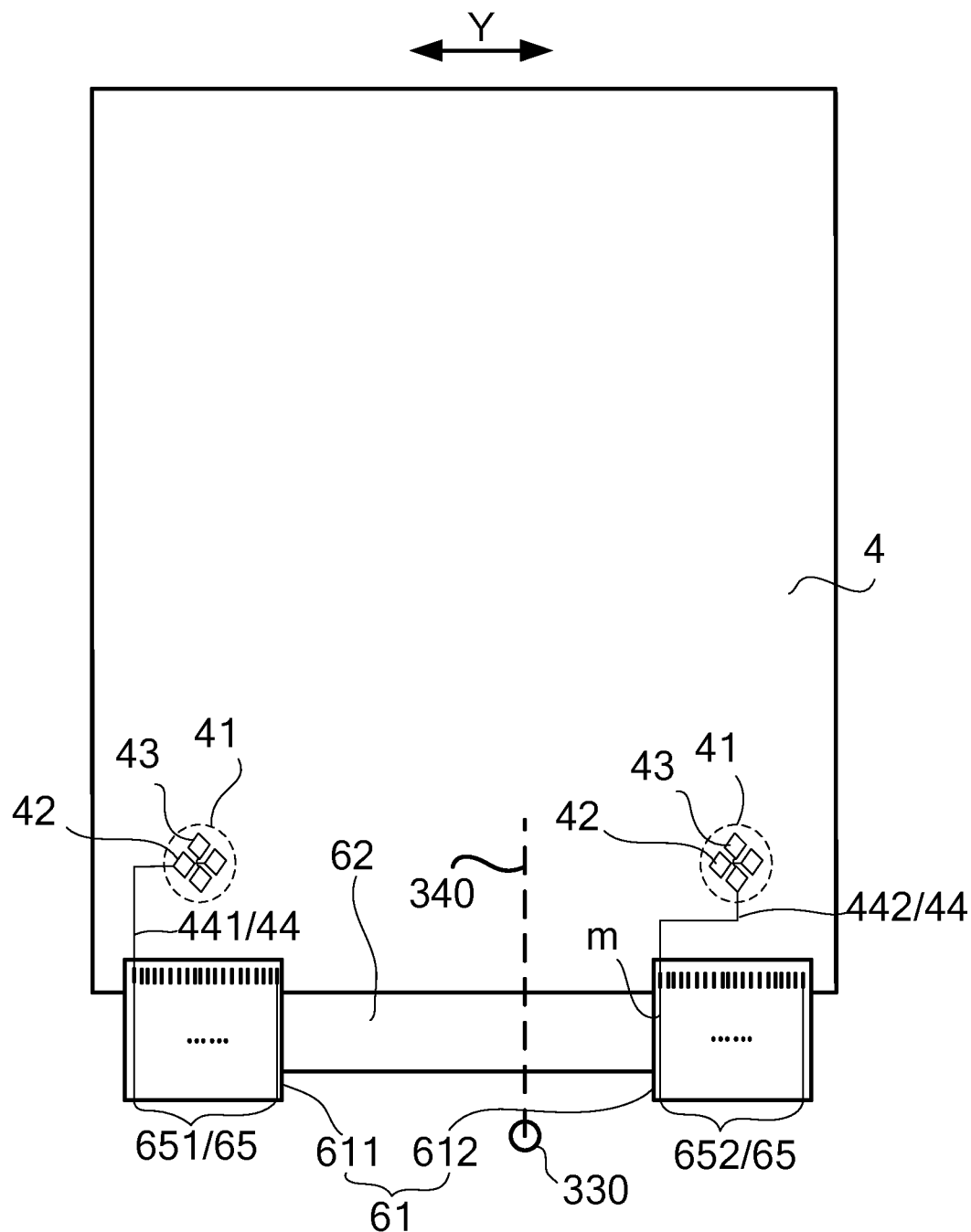
FIG. 7 is a top view of a display module, in accordance with some embodiments of the present disclosure.

As shown in FIGS. 6 and 7 (FIG. 6 is a bottom view of the display module 100 shown in FIG. 3 with the circuit board 7 removed, and FIG. 7 is a top view of the display module 100 shown in FIG. 3 with the cover plate 1 and the polarizer 3 removed), the first sub-circuit board 611 and the second sub-circuit board 612 are located on two sides of a first plane 340, respectively. The first plane 340 passes through the antenna feed point 330, and is perpendicular to the second direction. In this way, in a case where an area formed by the first sub-circuit board 611 and the second sub-circuit board 612 in the second direction Y has a fixed size, the antenna 300 is prevented from occupying a space outside the area formed by the first sub-circuit board 611 and the second sub-circuit board 612, which is beneficial to reducing a dimension of the display apparatus in the second direction Y. Moreover, by this arrangement, the antenna 300 is opposite to a space between the first sub-circuit board 611 and the second sub-circuit board 612, so that the antenna 300 may extend partially into the space between the first sub-circuit board 611 and the second sub-circuit board 611, and the arrangement of the antenna 300, the first sub-circuit board 611 and the second sub-circuit board 611 is more compact, which is beneficial to reducing the size of the lower bezel of the display apparatus.

As shown in FIG. 7, a first end of the first sub-circuit board 611 and a first end of the second sub-circuit board 612 are connected to the touch film 4. As shown in FIGS. 3 and 6, a second end of the first sub-circuit board 611 and a second end of the second sub-circuit board 612 are bonded to the connection circuit board 72 through a first bonding to pin group 64. The first bonding pin group 64 includes a first sub-pin group 641 disposed on the second end of the first sub-circuit board 611 and a second sub-pin group 642 disposed on the second end of the second sub-circuit board 612.

As shown in FIG. 7, the touch film 4 further includes touch lead groups 44 connected to the touch electrode 41. The touch lead groups 44 include a first touch lead group 441 (i.e., RX lead group) electrically connected to the first electrode array 42 and a second touch lead group 442 (i.e., TX lead group) electrically connected to the second electrode array 43. It will be noted that since the first touch lead group 441 and the second touch lead group 442 both have many touch leads, only two touch leads (i.e., a touch lead in the first touch lead group 441 and a touch lead in the second touch lead group 442) are shown in the figure, and other touch leads are not shown.

As shown in FIGS. 6 and 7, the first bending portion 61 is further provided with a connection lead group 65. The connection lead group 65 includes a first sub-lead group 651 disposed on the first sub-circuit board 611 and a second sub-lead group 652 disposed on the second sub-circuit board 612. The first sub-pin group 641 on the first sub-circuit board 611 is electrically connected to the first electrode array 42 through the first sub-lead group 651 and the first touch lead group 441, and the second sub-pin group 642 on the second sub-circuit board 612 is electrically connected to the second electrode array 43 through the second sub-lead group 652 and the second touch lead group 442. It will be noted that since the first sub-lead group 651 and the second sub-lead group 652 both have many connection leads, only two connection leads in the first sub-lead group 651 and two connection leads in the second sub-lead group 652 are shown, and other connection leads are not shown and indicated by ellipses.

As shown in FIGS. 6 and 7, when the display apparatus operates, the connection lead (i.e., the connection lead m shown in FIG. 7) on a side of the second sub-circuit board 612 proximate to the first plane 340 is easy to interfere with the antenna feed point 330 due to a small distance between the connection lead and the antenna feed point 330, thereby affecting the signal transmission and reception of the antenna 300.

Figure 8:
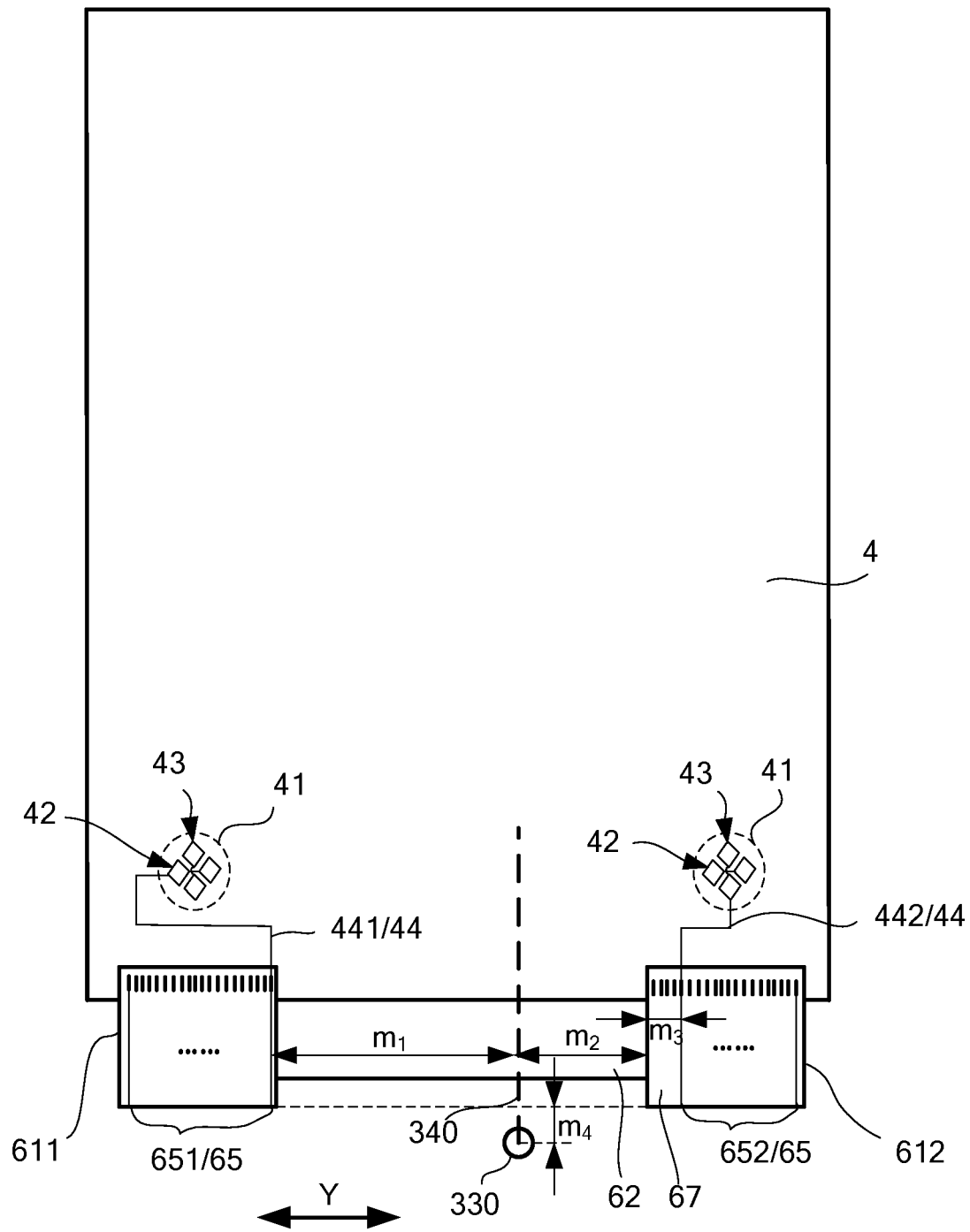
FIG. 8 is a top view of a display module, in accordance with some other embodiments of the present disclosure.
Figure 9:
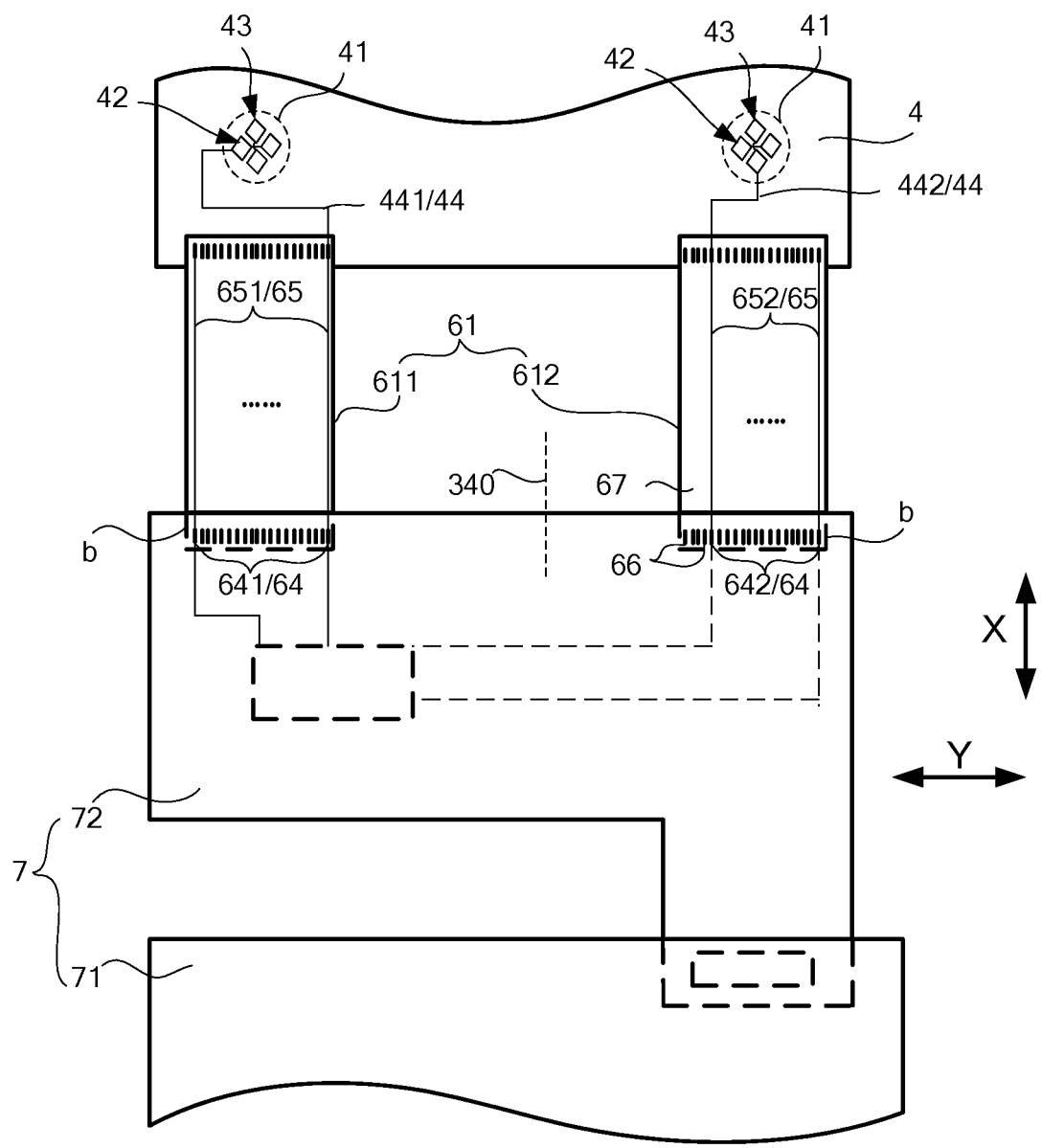
FIG. 9 is a schematic diagram of the display module in FIG. 8 with a first bending portion and a circuit board unfolded.

In some embodiments, in order to reduce the signal interference of the connection lead group 65 to the antenna feed point 330, as shown in FIGS. 8 and 9 (FIG. 8 shows a top view of the display module 100 in some embodiments with the cover plate 1 removed, and FIG. 9 is a schematic diagram of the display module in FIG. 8 with the first bending portion 61 and the circuit board 7 unfolded), a first redundant pin group 66 that is bonded to the circuit board 7 is further provided on the second end (the b end shown in FIG. 9) of the second sub-circuit board 612. The first redundant pin group 66 and the second sub-pin group 642 are arranged in the second direction Y. The first redundant pin group 66 is located on a side of the second sub-pin group 642 proximate to the first plane 340, so that a wiring blank area 67 of the second sub-circuit board 612 is formed on a side of the second sub-lead group 652 proximate to the first plane 340. The first redundant pin group 66 is provided, so that a distance between the connection lead of the second sub-lead group 652 proximate to the first plane 340 and the first plane 340 is increased. Thus, the distance between the connection lead and the antenna feed point 330 is increased, so as to reduce the interference of the connection lead group 65 to the antenna feed point 330 greatly, thereby ensuring that the antenna 300 in the display apparatus transmits and receives signals normally.

The antenna feed point 330 may be provided close to the first sub-circuit board 611 in addition to the second sub-circuit board 612. That is, the antenna feed point 330 may be provided on a left half side of the display module 100, and in this case, the first redundant pin group 66 is provided on the second end of the first sub-circuit board 611.

Figure 10:
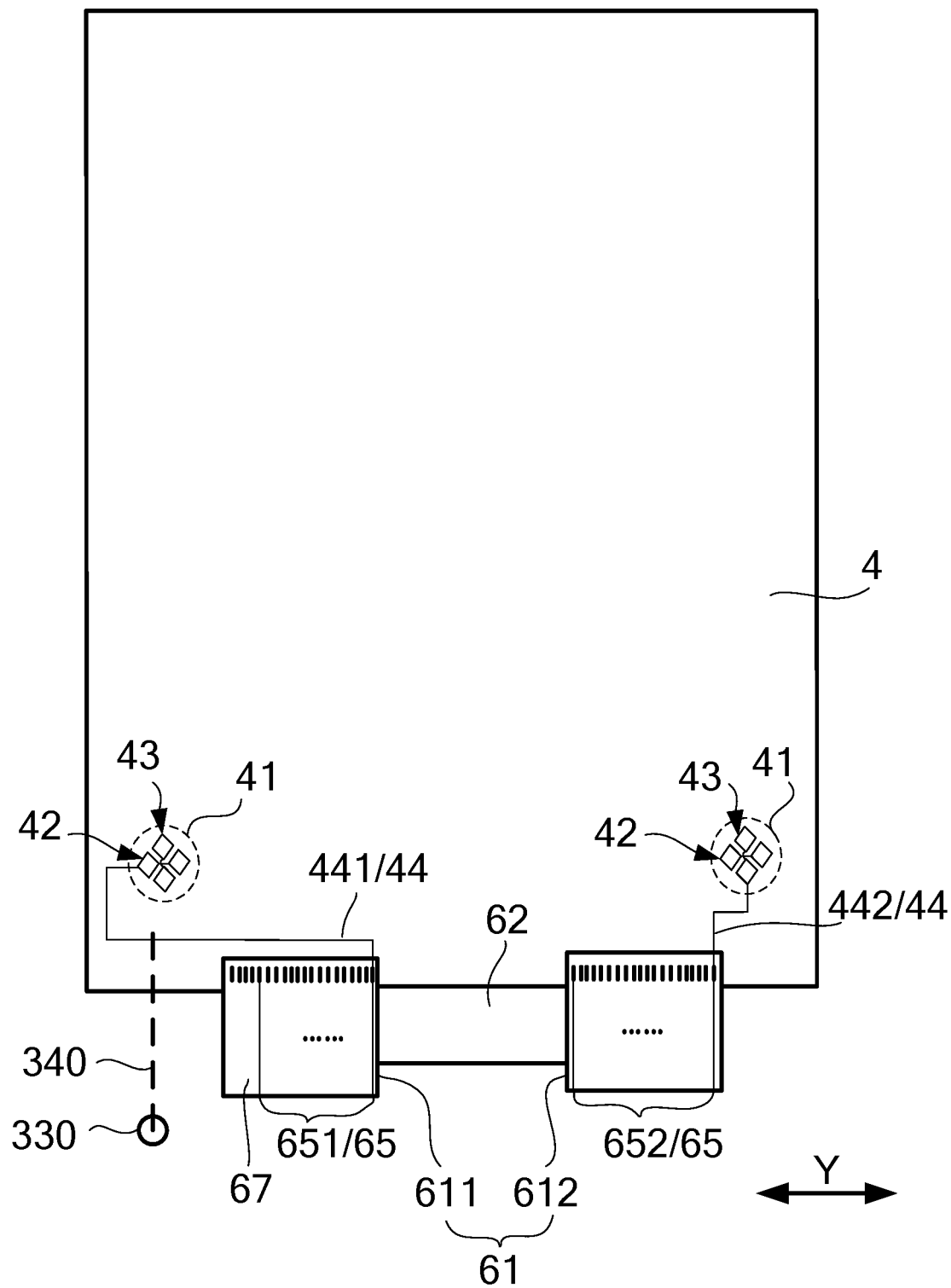
FIG. 10 is a top view of a display module, in accordance with yet other embodiments of the present disclosure.
Figure 11:
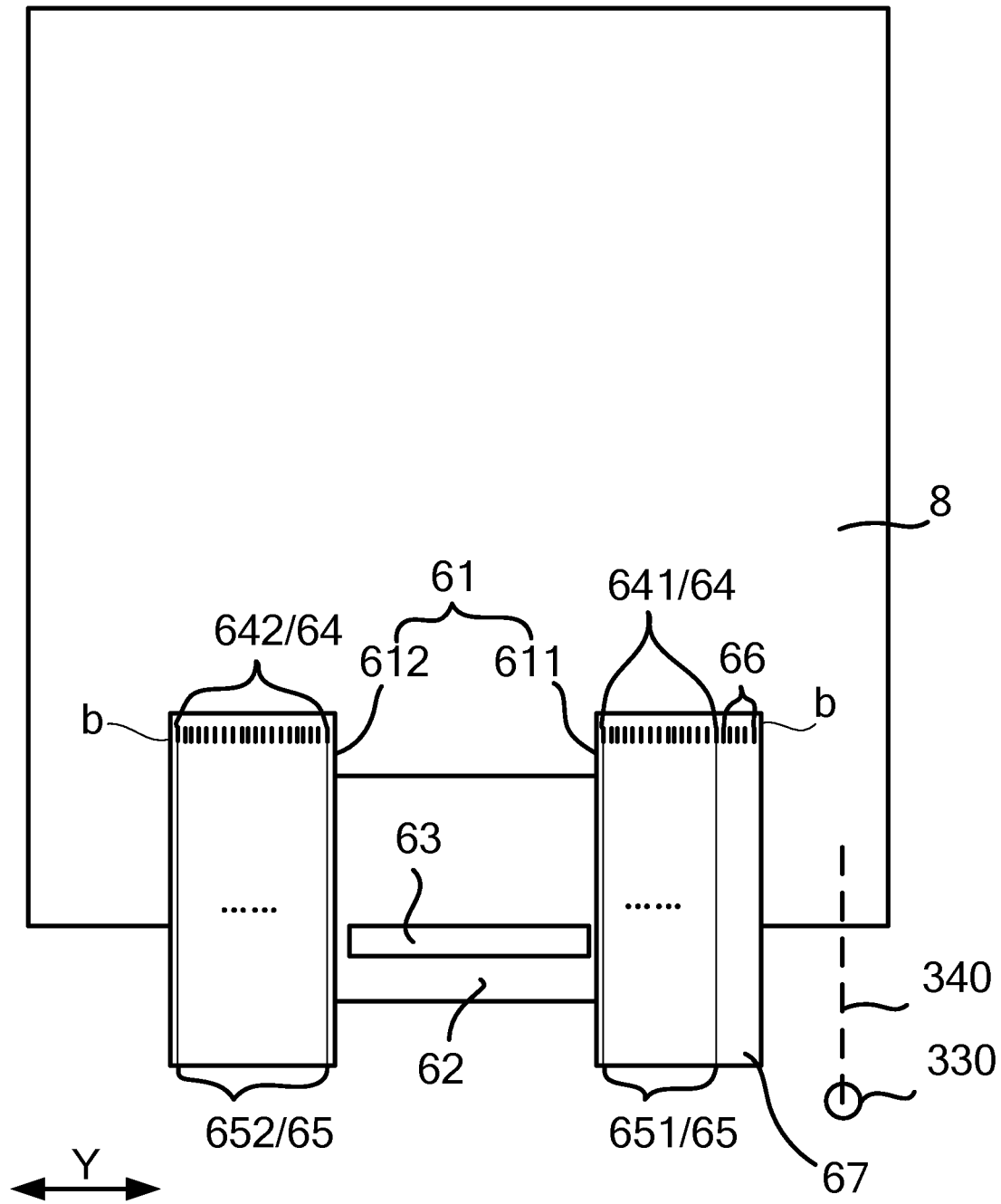
FIG. 11 is a bottom view of a display module, in accordance with yet other embodiments of the present disclosure.

In some embodiments, the first sub-circuit board 611 and the second sub-circuit board 612 may be provided on a same side of the first plane 340 in addition to two sides of the first plane 340. As shown in FIGS. 10 and 11 (FIG. 10 is a top view of the display module 100 in some embodiments with the cover plate 1 and the polarizer 3 removed, and FIG. 11 is a bottom view of the display module 100 in FIG. 10 with the circuit board 7 removed), the first sub-circuit board 611 and the second sub-circuit board 612 are located on a same side of the first plane 340, and the first sub-circuit board 611 is located on a side of the second sub-circuit board 612 proximate to the first plane 340. A first redundant pin group 66 is located between the first sub-pin group 641 and the first plane 340, and a wiring blank area 67 is located on the first sub-circuit board 611 between the first sub-lead group 651 and the first plane 340. In these embodiments, it is also possible to increase the distance between the connection lead and the antenna feed point 330 by providing the first redundant pin group 66 on the first sub-circuit board 611, so as to reduce the interference of the connection lead group 65 to the antenna feed point 330.

In addition to the first sub-circuit board 611 and the second sub-circuit board 612 being provided on the two sides of the first plane 340, respectively, in some embodiments, one of the first sub-circuit board 611 and the second sub-circuit board 612 may intersect with the first plane 340, which may be set according to actual situations.

Figure 12:
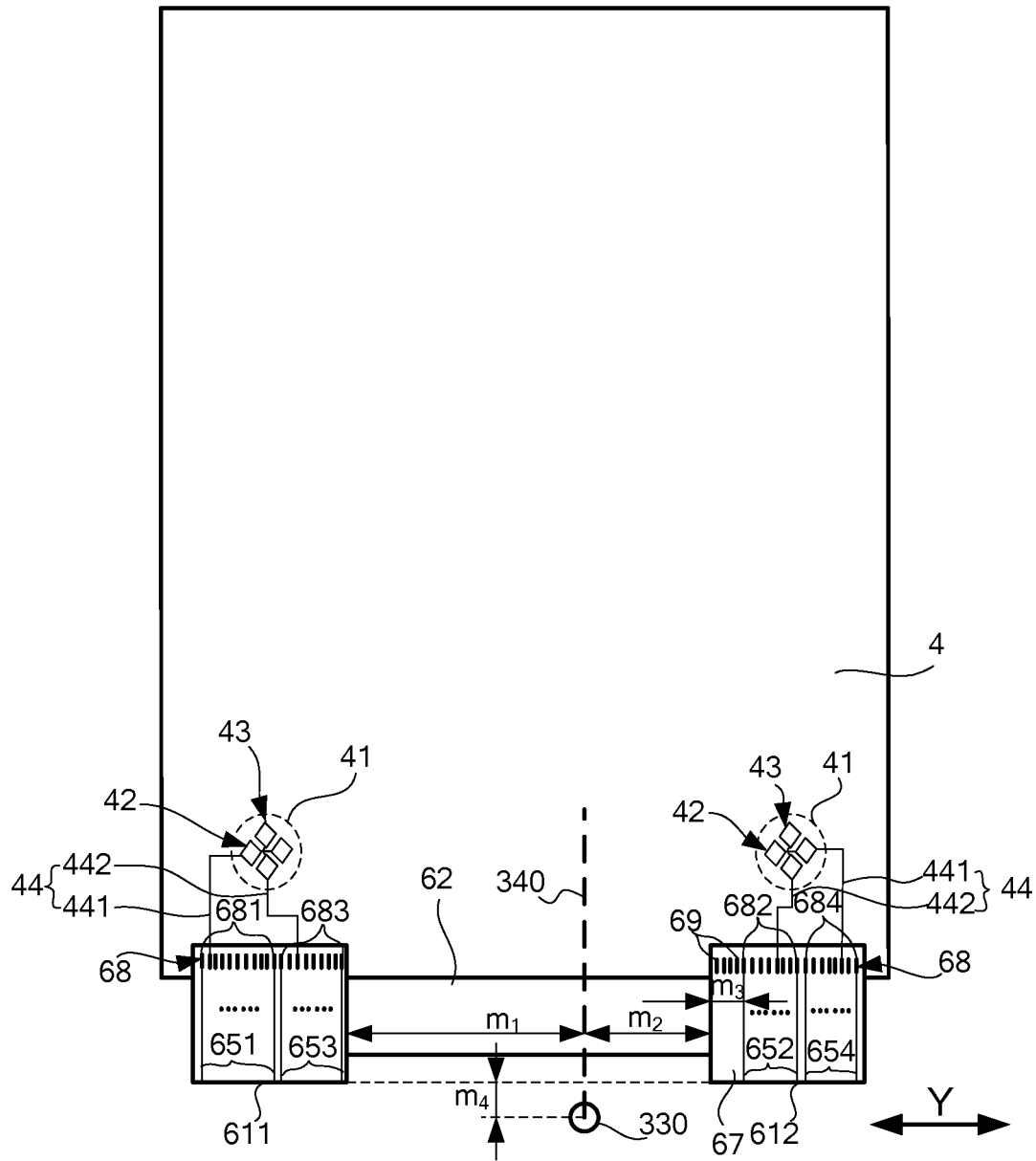
FIG. 12 is a top view of a display module, in accordance with yet other embodiments of the present disclosure.
Figure 13:
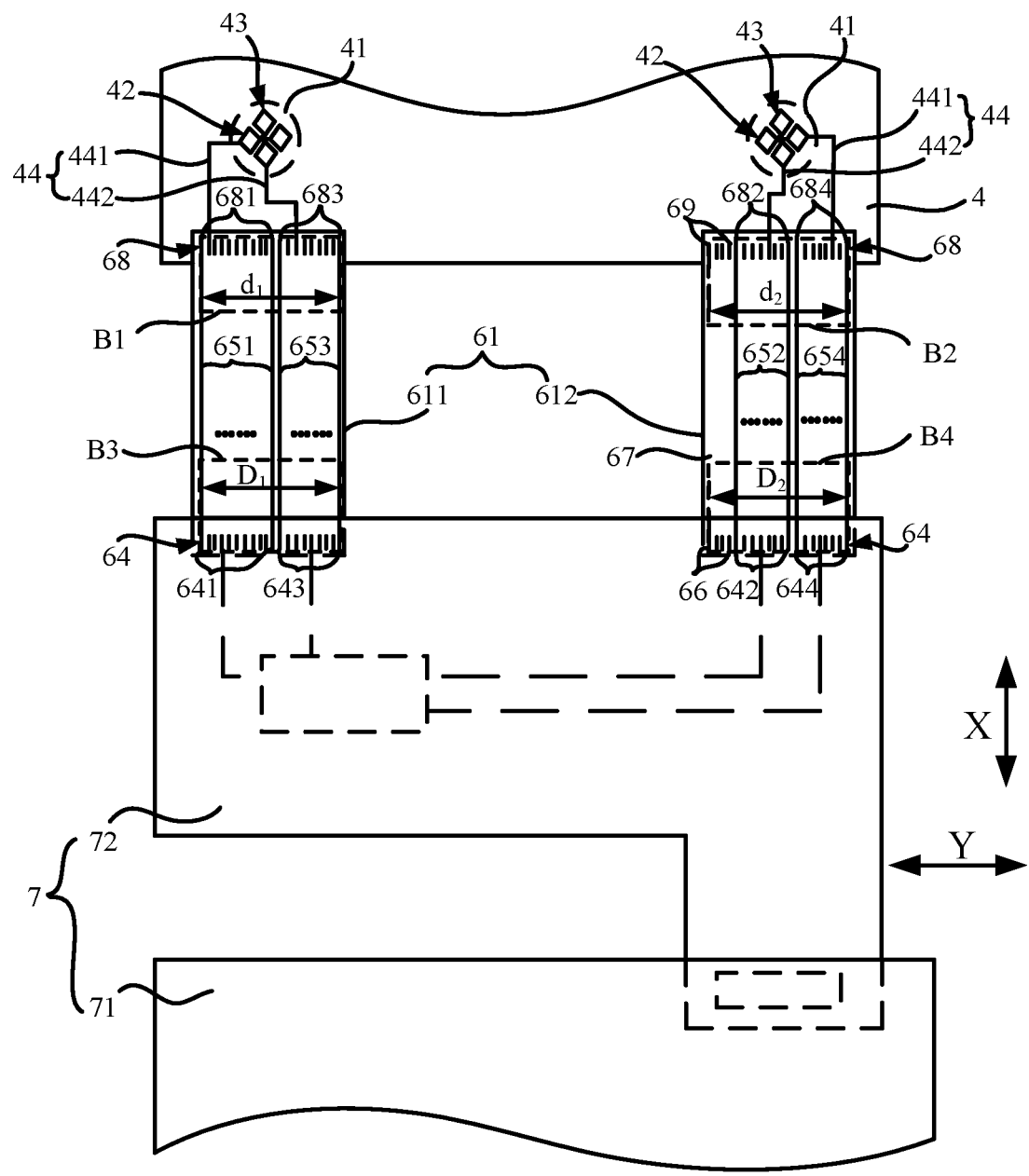
FIG. 13 is a schematic diagram of the display module in FIG. 12 with a first bending portion and a circuit board unfolded.

In some embodiments, in order to optimize the layout of the connection leads in a peripheral area of the touch film 4, as shown in FIGS. 12 and 13 (FIG. 12 is a top view of the display module 100 in some embodiments with the cover plate 1 removed, and FIG. 13 is a schematic diagram of the display module in FIG. 12 with the first bending portion 61 and the circuit board 7 unfolded), the first bonding pin group 64 further includes a third sub-pin group 643 disposed on the second end of the first sub-circuit board 611 and a fourth sub-pin group 644 disposed on the second end of the second sub-circuit board 612.

The third sub-pin group 643 and the first sub-pin group 641 are arranged in the second direction Y. The fourth sub-pin group 644 and the second sub-pin group 642 are arranged in the second direction Y, and the fourth sub-pin group 644 is located on a side of the second sub-pin group 642 away from the first redundant pin group 66.

The connection lead group 65 further includes a third sub-lead group 653 and a fourth sub-lead group 654. The third sub-lead group 643 is electrically connected to the second electrode array 43 through the third sub-lead group 653 and the second touch lead group 442. The fourth sub-lead group 644 is electrically connected to the first electrode array 42 through the fourth sub-lead group 654 and the first touch lead group 441.

In these embodiments, the sub-lead groups electrically connected to the first electrode array 42 are respectively distributed on the first sub-circuit board 611 and the second sub-circuit board 612, and the sub-lead groups electrically connected to the second electrode array 43 are respectively distributed on the first sub-circuit board 611 and the second sub-circuit board 612, so that the touch leads electrically connected to the first electrode array 42 and the second electrode array 43 in the peripheral area of the touch film 4 may be uniformly distributed on two sides of the touch film 4, so as to optimize the layout of the connection leads in the peripheral area of the touch film 4.

The relationship between the first bending portion 61 and the touch film 4 is not unique. In some embodiments, the first bending portion 61 and the touch film 4 may be of an integrative structure.

In some other embodiments, the first bending portion 61 and the touch film 4 may also be arranged separately. As shown in FIGS. 12 and 13, a second bonding pin group 68 that is bonded to the touch film 4 is further provided on an end of the first bending portion 61 proximate to the touch film 4.

The second bonding pin group 68 includes a fifth sub-pin group 681 and a sixth sub-pin group 683 that are disposed on the first end of the first sub-circuit board 611 and arranged in the second direction Y. The fifth pin group 681 is electrically connected to the first electrode array 42, and the first sub-lead group 651 is connected between the first sub-pin group 641 and the fifth sub-pin group 681. The sixth sub-pin group 683 is electrically connected to the second electrode array 43, and the third sub-lead group 653 is connected between the third sub-pin group 643 and the sixth sub-pin group 683.

The second bonding pin group 68 further includes a seventh sub-pin group 682, an eighth sub-pin group 684 and a second redundant pin group 69 that are disposed on the first end of the second sub-circuit board 612 and arranged in the second direction Y. The second redundant pin group 69 is located on a side of the seventh sub-pin group 682 and the eighth sub-pin group 684 proximate to the first plane 340. The seventh sub-pin group 682 is electrically connected to the second electrode array 43, and the second sub-lead group 652 is connected between the second sub-pin group 642 and the seventh sub-pin group 682. The eighth sub-pin group 684 is electrically connected to the first electrode array 42, and the fourth sub-lead group 654 is connected between the fourth sub-pin group 644 and the eighth sub-pin group 684.

In these embodiments, the first bending portion 61 and the touch film 4 are arranged separately, and the first bending portion 61 is bonded to the touch film 4 through the second bonding pin group 68, so that it is convenient to disassemble and replace the first bending portion 61 when the first bending portion 61 is damaged.

In some embodiments, in order to make the stress distribution on the first bending portion 61 is more uniform when the first bending portion 61 is bent, as shown in FIG. 13, in the second direction Y, a dimension of a bonding area B1 formed by the fifth sub-pin group 681 and the sixth pin group 683 is d1 (that is, a width of the bonding area B1 of the first sub-circuit board 611 and the touch film 4 is d1).

A dimension of a bonding area B2 formed by the second redundant pin group 69, the seventh sub-pin group 682 and the eighth sub-pin group 684 is d2 (that is, a width of the bonding area B2 of the second sub-circuit board 612 and the touch film 4 is d2). Here, d1 and d2 satisfy that d1 is equal to d2 (i.e., d1=d2).

The width of the bonding area of the first sub-circuit board 611 and the touch film 4 is set to be equal to the width of the bonding area of the second sub-circuit board 612 and the touch film 4, so that a connection strength between the first sub-circuit board 611 and the touch film 4 is equal to a connection strength between the second sub-circuit board 612 and the touch film 4. When the first sub-circuit board 611 and the second sub-circuit board 612 are bent, stress is uniformly distributed on the first sub-circuit board 611 and the second sub-circuit board 612, so that the probability of damage to the first sub-circuit board 611 and the second sub-circuit board 612 due to an unbalanced stress distribution during bending is greatly reduced.

In some embodiments, in order to optimize the distribution of the connection leads on the first sub-circuit board 611 and the second sub-circuit board 612, as shown in FIG. 13, in the second direction Y, a dimension of a bonding area B3 formed by the first sub-pin group 641 and the third sub-pin group 643 is D1, and a dimension of a bonding area B4 formed by the first redundant pin group 66, the second sub-pin group 642 and the fourth sub-pin group 644 is D2. Here, D1 and d1 satisfy that D1 is equal to d1 (i.e., D1=d1), and D2 and d2 satisfy that D2 is equal to d2 (i.e., D2=d2). Widths of the bonding areas at two ends of the first sub-circuit board 611 in the first direction X are set to be equal to each other, and widths of the bonding areas at two ends of the second sub-circuit board 612 in the first direction X are set to be equal to each other, so that the connection leads on each of the first sub-circuit board 611 and the second sub-circuit board 612 may be arranged in parallel, which facilitates the arrangement of the connection leads on each of the first sub-circuit board 611 and the second sub-circuit board 612.

In some embodiments, as shown in FIG. 12, in the second direction Y, a width $m_1$ of a gap between the first plane 340 and the first sub-circuit board 611 is in a range of 2.2 mm to 7 mm, and a width $m_2$ of a gap between the first plane 340 and the second sub-circuit board 612 is in a range of 0.2 mm to 5 mm. In the second direction Y, a dimension $m_3$ of the wiring blank area 67 is greater than or equal to 3 mm. By this arrangement, not only the sub-lead groups on the first sub-circuit board 611 may be better prevented from interfering with signals of the antenna feed point 330, but also the sub-lead groups on the second sub-circuit board 612 may be better prevented from interfering with signals of the antenna feed point 330.

In some embodiments, as shown in FIG. 12, in the first direction X, lengths of the first sub-circuit board 611 and the second sub-circuit board 612 are equal to each other, and top ends (i.e., ends of the first sub-circuit board 611 and the second sub-circuit board 612 proximate to the antenna feed point 330 in FIG. 12) of the first sub-circuit board 611 and the second sub-circuit board 612 after being bent are flush with each other. A distance ma between the antenna feed point 330 and the top end of the first sub-circuit board 611 is in a range of 0.2 mm to 2 mm, so as to avoid a large-sized lower bezel of the display apparatus.

Figure 14:
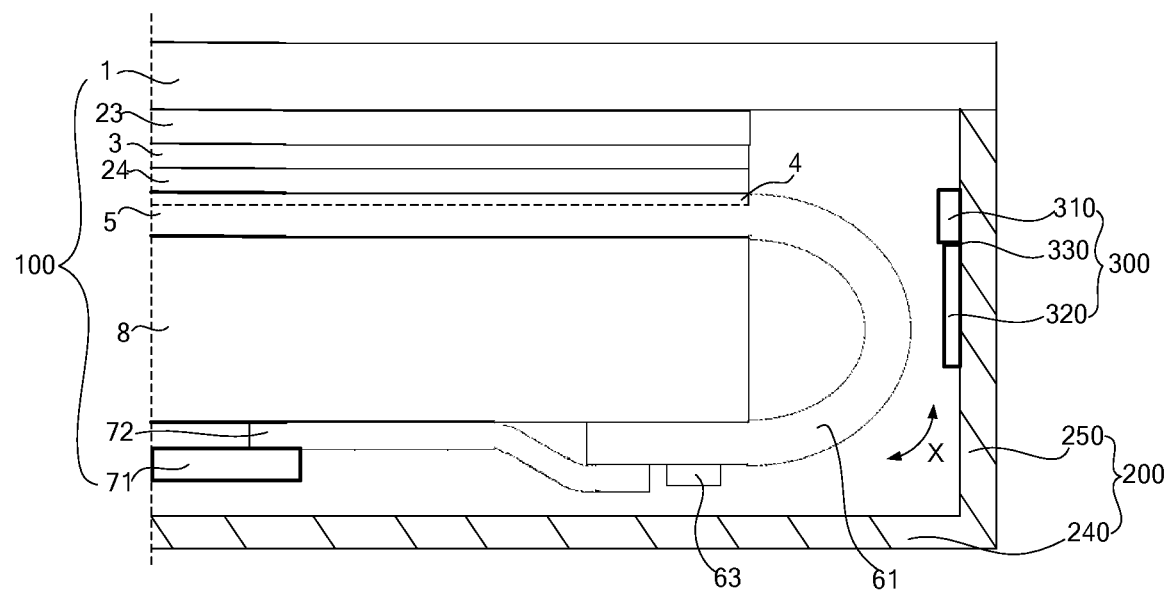
FIG. 14 is a schematic structural diagram of a display apparatus, in accordance with some other embodiments of the present disclosure.

In some embodiments, as shown in FIG. 14 (FIG. 14 is a schematic structural diagram of a display module 100 in some embodiments), the touch film 4 is integrated with the display panel 5, and the display module 100 includes the cover plate 1, a third adhesive layer 23, the polarizer 3, a fourth adhesive layer 24, the display panel 5, the heat dissipation film 8 and the circuit board 7 that are sequentially stacked.

The display panel 5 is a flexible display panel 5. The first bending portion 61 and the display panel 5 are of an integrative structure. The third adhesive layer 23 is used for adhering the cover plate 1 to the polarizer 3, and the fourth adhesive layer 24 is used for adhering the polarizer 3 to the touch film 4.

As shown in FIG. 14, the circuit board 7 includes the main board 71 and the connection circuit board 72, and the connection circuit board 72 is connected between the first bending portion 61 and the main board 71.

As shown in FIG. 14, the housing 200 includes a housing bottom wall 240 and a housing side wall 250 disposed on a periphery of the housing bottom wall 240. The antenna 300 is provided on the housing side wall 250 located on a side of the display panel 5, and the cover plate 1 is provided at an opening of the housing 200.

Figure 15:
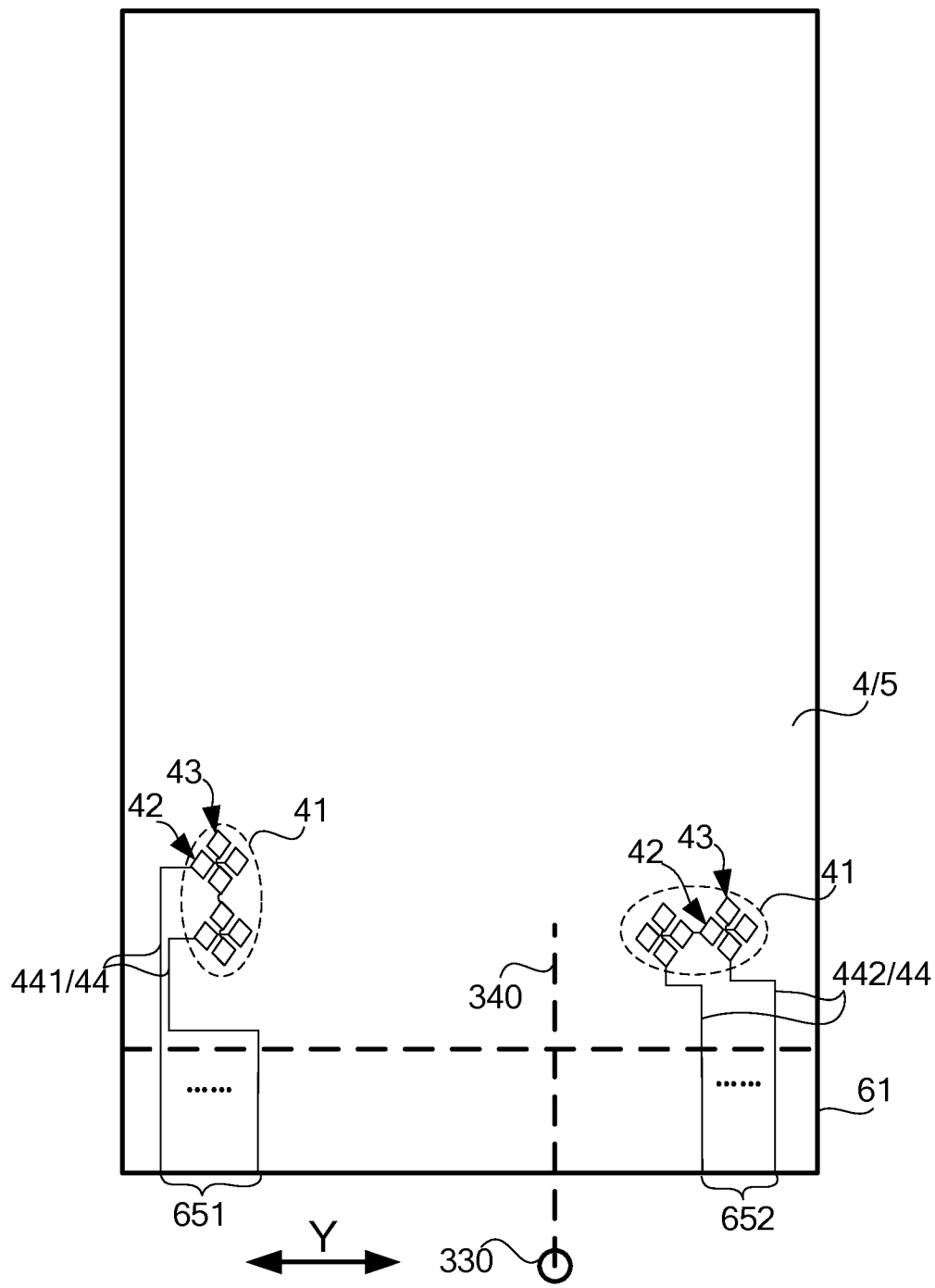
FIG. 15 is a top view of a display module in FIG. 14 with a cover plate and a polarizer removed.
Figure 16:
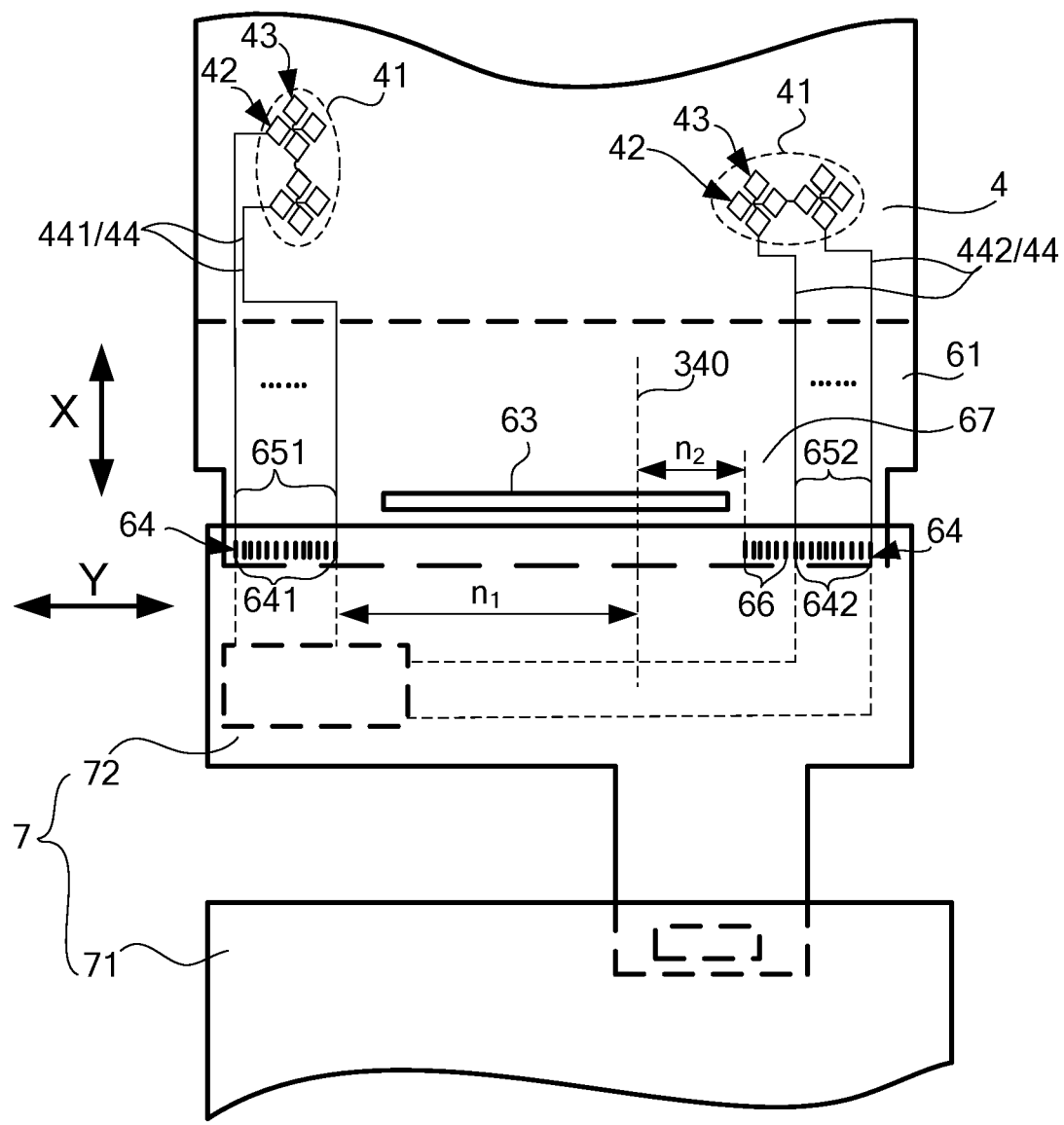
FIG. 16 is a schematic diagram of the display module in FIG. 15 with a first bending portion and a circuit board unfolded.

As shown in FIGS. 15 and 16 (FIG. 15 is a top view of the display module 100 in some embodiments with the cover plate 1 removed, and FIG. 16 is a schematic diagram of the display module in FIG. 15 with the first bending portion 61 and the circuit board 7 unfolded), in these embodiments, the first bonding pin group 64 and the first redundant pin group 66 are provided on an end of the first bending portion 61 away from the display panel 5. The first bonding pin group 64 includes the first sub-pin group 641 and the second sub-pin group 642. The first sub-pin group 641 and the second sub-pin group 642 are arranged at an interval in the second direction Y, and are located on two sides of the first plane 340, respectively. A distance $n_1$ between the first sub-pin group 641 and the first plane 340 is greater than a distance $n_2$ between the first redundant pin group 66 and the first plane 340. The first redundant pin group 66 and the second sub-pin group 642 are located on a same side of the first plane 340, and the first redundant pin group 66 is located between the second sub-pin group 642 and the first plane 340. The wiring blank area 67 is located between the second sub-lead group 652 and the first plane 340.

Of course, the antenna feed point 330 may be provided on a left half side of the display module 100 in addition to a right half side of the display module 100. In this case, the first redundant pin group 66 is located between the first sub-pin group 641 and the first plane 340.

The first sub-pin group 641 and the second sub-pin group 642 may be provided on a same side of the first plane 340 in addition to the two sides of the first plane 340. The first redundant pin group 66 is located between a sub-pin group proximate to the first plane 340 and the first plane 340.

Beneficial effects obtained by providing the first redundant pin group 66 in these embodiments are the same as the beneficial effects obtained by providing the first redundant pin group 66 in the above embodiments in which the touch film 4 and the display panel 5 are arranged separately, and will not be repeated herein.

Figure 17:
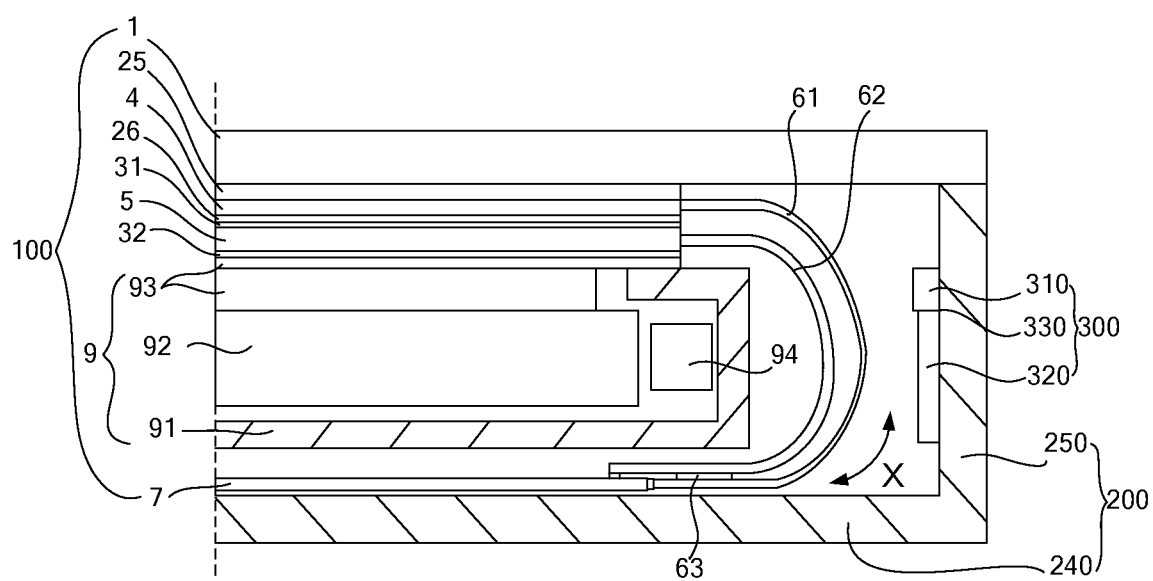
FIG. 17 is a schematic structural diagram of a display apparatus, in accordance with yet other embodiments of the present disclosure.

In some embodiments, as shown in FIG. 17 (FIG. 17 is a schematic structural diagram of the display module 100 in some embodiments), the display panel 5 is a liquid crystal display panel, and the display module 100 includes the cover plate 1, a fifth adhesive layer 25, the touch film 4, a sixth adhesive layer 26, an upper polarizer 31, the display panel 5, a lower polarizer, a backlight 9 and the circuit board 7 that are sequentially arranged.

The backlight 9 includes a back plate 91, a light guide plate 92 disposed on a side of the back plate 91, an optical film 93 disposed on a side of the light guide plate 92 away from the back plate 91, and a light source 94 disposed in a lateral direction of the light guide plate 92.

An end of the first bending portion 61 is bonded to the touch film 4, and another end of the first bending portion 61 is bonded to the circuit board 7. An end of the second bending portion 62 is bonded to the display panel 5, and another end of the second bending portion 62 is bonded to the circuit board 7.

As shown in FIG. 17, the housing 200 includes a housing bottom wall 240 and a housing side wall 250 disposed on a periphery of the housing bottom wall 240. The antenna 300 is provided on the housing side wall 250 located on a side of the display panel 5, and the cover plate 1 is provided at an opening of the housing 200.

In these embodiments, the arrangement of the first bending portion 61, and the specific arrangement of bonding pin groups, connection leads, a first redundant pin group 66 and a second redundant pin group 69 on the first bending portion 61 are the same as the arrangement in the above embodiments in which the touch film 4 and the display panel 5 are arranged separately, and will not be repeated herein.

In the description of the above embodiments, the specific features, structures, materials or characteristics may be combined in any suitable manner in any one or more embodiments or examples.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display apparatus, comprising:
   a display panel;
   a touch film stacked on a display side of the display panel and including a touch electrode;
   a circuit board disposed on a side of the display panel away from the touch film;
   an antenna located on a side of the display panel and including an antenna feed point; and
   a first bending portion, wherein in a first direction, an end of the first bending portion is connected to a side edge of the touch film proximate to the antenna feed point, and another end of the first bending portion is provided with a first bonding pin group and a first redundant pin group that are arranged in a second direction and bonded to the circuit board; the first direction is an extending direction of the first bending portion, and the second direction is perpendicular to the first direction and a thickness direction of the touch film; wherein
   the first bending portion is further provided with a connection lead group, the first bonding pin group is electrically connected to the touch electrode through the connection lead group; and
   the first redundant pin group is located on a side of the first bonding pin group proximate to a first plane, so that a wiring blank area of the first bending portion is formed on a side of the connection lead group proximate to the first plane; the first plane passes through the antenna feed point, and is perpendicular to the second direction.

2. The display apparatus according to claim 1, wherein the first bonding pin group includes a first sub-pin group and a second sub-pin group, and the first sub-pin group and the second sub-pin group are arranged at an interval in the second direction, and are located on two sides of the first plane, respectively; a distance between a side of the first sub-pin group proximate to the first plane and the first plane is greater than a distance between a side of the first redundant pin group proximate to the first plane and the first plane;
   the touch electrode includes a first electrode array and a second electrode array, the connection lead group includes a first sub-lead group and a second sub-lead group, the first sub-pin group is electrically connected to the first electrode array through the first sub-lead group, and the second sub-pin group is electrically connected to the second electrode array through the second sub-lead group; and the first redundant pin group and the second sub-pin group are located on a same side of the first plane, the first redundant pin group is located between the second sub-pin group and the first plane, and the wiring blank area is located between the second sub-lead group and the first plane.

3. The display apparatus according to claim 2, wherein the touch film and the display panel are arranged separately;

the display apparatus further comprises a second bending portion and a drive chip; a first end of the second bending portion is connected to a first side edge of the display panel, a second end of the second bending portion is connected to the circuit board, and the first side edge is a side edge of the display panel proximate to the first bending portion; the drive chip is disposed on an outer side surface of the second bending portion;

the first bending portion is a touch circuit board including a first sub-circuit board and a second sub-circuit board that extend in the first direction, and the first sub-circuit board and the second sub-circuit board are arranged at an interval in the second direction, and are located on two sides of the drive chip, respectively;

in the first direction, a first end of the first sub-circuit board is connected to the touch film, and a second end of the first sub-circuit board is provided with the first sub-pin group; the first sub-lead group is located on the first sub-circuit board;

in the first direction, a first end of the second sub-circuit board is connected to the touch film, and a second end of the second sub-circuit board is provided with the second sub-pin group and the first redundant pin group; the second sub-lead group and the wiring blank area are located on the second sub-circuit board.

4. The display apparatus according to claim 3, wherein the first bonding pin group further includes a third sub-pin group disposed on the second end of the first sub-circuit board and a fourth sub-pin group disposed on the second end of the second sub-circuit board;

the third sub-pin group and the first sub-pin group are arranged in the second direction; the fourth sub-pin group and the second sub-pin group are arranged in the second direction, and the fourth sub-pin group is located on a side of the second sub-pin group away from the first redundant pin group; and the connection lead group further includes a third sub-lead group and a fourth sub-lead group, the third sub-pin group is electrically connected to the second electrode array through the third sub-lead group, and the fourth sub-pin group is electrically connected to the first electrode array through the fourth sub-lead group.

5. The display apparatus according to claim 4, wherein a second bonding pin group that is bonded to the touch film is further provided on an end of the first bending portion proximate to the touch film; wherein the second bonding pin group includes a fifth sub-pin group and a sixth sub-pin group that are disposed on the first end of the first sub-circuit board and arranged in the second direction; wherein the fifth sub-pin group is electrically connected to the first electrode array, and the first sub-lead group is connected between the first sub-pin group and the fifth sub-pin group; and the sixth sub-pin group is electrically connected to the second electrode array, and the third sub-lead group is connected between the third sub-pin group and the sixth sub-pin group; and the second bonding pin group further includes a seventh sub-pin group, an eighth sub-pin group, and a second redundant pin group that are disposed on the first end of the second sub-circuit board and arranged in the second direction; wherein the second redundant pin group is located on a side of the seventh sub-pin group and the eighth sub-pin group proximate to the first plane;

the seventh sub-pin group is electrically connected to the second electrode array, and the second sub-lead group is connected between the second sub-pin group and the seventh sub-pin group; and the eighth sub-pin group is electrically connected to the first electrode array, and the fourth sub-lead group is connected between the fourth sub-pin group and the eighth sub-pin group.

6. The display apparatus according to claim 5, wherein in the second direction, a dimension of a bonding area formed by the fifth sub-pin group and the sixth sub-pin group is $d_1$, and a dimension of a bonding area formed by the second redundant pin group, the seventh sub-pin group and the eighth sub-pin group is $d_2$; wherein $d_1$ and $d_2$ satisfy that $d_1$ is equal to $d_2$.

7. The display apparatus according to claim 6, wherein in the second direction, a dimension of a bonding area formed by the first sub-pin group and the third sub-pin group is $D_1$, and a dimension of a bonding area formed by the first redundant pin group, the second sub-pin group and the fourth sub-pin group is $D_2$; wherein $D_1$ and $d_1$ satisfy that $D_1$ is equal to $d_1$; $D_2$ and $d_2$ satisfy that $D_2$ is equal to $d_2$.

8. The display apparatus according to claim 3, wherein the first sub-circuit board and the second sub-circuit board are located on the two sides of the first plane, respectively, and a distance between the first sub-circuit board and the first plane is greater than a distance between the second sub-circuit board and the first plane.

9. The display apparatus according to claim 8, wherein in the second direction, a width of a gap between the first plane and the first sub-circuit board is in a range of 2.2 mm to 7 mm;

in the second direction, a width of a gap between the first plane and the second sub-circuit board is in a range of 0.2 mm to 5 mm; and in the second direction, a dimension of the wiring blank area is greater than or equal to 3 mm.

10. The display apparatus according to claim 3, wherein the display panel is a flexible display panel, and the second bending portion and the display panel are of an integrative structure.

11. The display apparatus according to claim 2, wherein the touch film is integrated with the display panel, the display panel is a flexible display panel, and the first bending portion and the display panel are of an integrative structure.

12. The display apparatus according to claim 2, wherein the touch film further includes touch lead groups, and the touch lead groups include a first touch lead group electrically connected to the first electrode array and a second touch lead group electrically connected to the second electrode array; and the first sub-pin group is electrically connected to the first electrode array through the first sub-lead group and the first touch lead group, and the second sub-pin group is electrically connected to the second electrode array through the second sub-lead group and the second touch lead group.

13. The display apparatus according to claim 12, wherein the touch film and the display panel are arranged separately;
the first bending portion is a touch circuit board including a first sub-circuit board and a second sub-circuit board that extend in the first direction, and the first sub-circuit board and the second sub-circuit board are arranged at an interval in the second direction, and are located on the same side of the first plane; the first sub-circuit board is located on a side of the second sub-circuit board proximate to the first plane;
in the first direction, a first end of the first sub-circuit board is connected to the touch film, and a second end of the first sub-circuit board is provided with the first sub-pin group and the first redundant pin group; the first sub-lead group and the wiring blank area are located on the first sub-circuit board;
in the first direction, a first end of the second sub-circuit board is connected to the touch film, and a second end of the second sub-circuit board is provided with the second sub-pin group; the second sub-lead group is located on the second sub-circuit board.

14. The display apparatus according to claim 1, wherein the first bonding pin group includes a first sub-pin group and a second sub-pin group; the second sub-pin group, the first sub-pin group and the first redundant pin group are sequentially arranged in the second direction, and are located on a same side of the first plane;
the touch electrode includes a first electrode array and a second electrode array, the connection lead group includes a first sub-lead group and a second sub-lead group, the first sub-pin group is electrically connected to the first electrode array through the first sub-lead group, and the second sub-pin group is electrically connected to the second electrode array through the second sub-lead group; and
the first redundant pin group is located between the first sub-pin group and the first plane, and the wiring blank area is located between the first sub-lead group and the first plane.

15. The display apparatus according to claim 1, further comprising a housing including a front housing and a rear housing; wherein
the front housing includes a front-housing bottom wall and a front-housing side wall located on a periphery of the front-housing bottom wall, and the front-housing side wall is provided with a flange extending to an outer side of the front housing; the rear housing includes a rear-housing bottom wall and a rear-housing side wall located on a periphery of the rear-housing bottom wall; the rear-housing side wall is clamped on an outer side of the front-housing side wall, and abuts against the flange, so that the front housing and the rear housing are fastened together, and an installation space is formed between the front-housing bottom wall and the rear-housing bottom wall;
the display panel, the touch film, the antenna, and the first bending portion are disposed in the front housing; the circuit board includes a main board and a connection circuit board, and the main board is located in the installation space; an end of the connection circuit board is located in the front housing, and another end of the connection circuit board extends into the installation space, and is electrically connected to the main board.

* * * * *